United States Patent [19]

Hirao et al.

[11] 4,426,700

[45] Jan. 17, 1984

[54] SEMICONDUCTOR LASER DEVICE

[75] Inventors: Motohisa Hirao, Tokyo; Atsutoshi Doi, Ohme; Michiharu Nakamura, Hinodemachi; Shinji Tsuji, Kokubunji; Takao Mori, Hachioji, all of Japan

[73] Assignee: Hitachi, Ltd., Tokyo, Japan

[21] Appl. No.: 260,744

[22] Filed: May 5, 1981

[30] Foreign Application Priority Data

May 9, 1980 [JP] Japan .................................. 55-60619

[51] Int. Cl.$^3$ ............................................... H01S 3/19
[52] U.S. Cl. ......................................... 372/45; 357/17; 372/46
[58] Field of Search ................. 372/44, 45, 46; 357/17

[56] References Cited

PUBLICATIONS

Hirao et al. "Long Wavelength In GaAsP/InP Lasers for Optical Fiber Communications Systems", *Journal of Optical Communications*, 1 (1980), pp. 10-14.

*Primary Examiner*—James W. Davie
*Attorney, Agent, or Firm*—Kenyon & Kenyon

[57] ABSTRACT

A buried-heterostructure semiconductor laser including a mesa-shaped optical confinement region having an active layer and a clad layer and disposed on a semiconductor substrate; a burying layer burying both side surfaces of the region; and at least one p-n junction so formed inside the burying layer in parallel to the active layer as to be brought under the reversely biased state during the operation of the laser; wherein surface protection semiconductor layers are formed on the mesa-shaped optical confinement region and on the burying layer, respectively, for protecting the semiconductor assembly in the arrangement such that these surface protection semiconductor layers do not come into direct contact with each other. Even if the forbidden band gas of these surface protection semiconductor layers are relatively small, it is possible to realize a semiconductor laser having an extremely small leakage current and reduced variance of threshold current values, while protecting the surface of the multi-layer semiconductor layers.

6 Claims, 14 Drawing Figures

SEMICONDUCTOR LASER DEVICE

BACKGROUND OF THE INVENTION

1. Field of the Invention

This invention relates to a semiconductor laser device and more specifically, to a buried-heterostructure laser device.

2. Description of the Prior Art

Semiconductor laser devices are generally of a double-hetero structure laser (generally referred to as a "DH laser") that has high optical confinement in the junction region. This DH laser is constructed by so forming semiconductor layers as to interpose an active layer, in which laser oscillation or light modulation is effected, between them, which semiconductor layers have a refractive index lower than that of the active layer and a greater forbidden band gap.

The DH laser has varying refractive indices in the longitudinal direction or in the direction of depth, but no difference of the refractive index occurs in the transverse direction. Accordingly a buried-hetero structure laser (generally referred to as a "BH laser") has been proposed in which a belt-like mesa is formed on a crystal surface which is parallel to the hetero-junction surface and a semiconductor layer of a low refractive index is formed in this mesa region.

Of the BH laser, a detailed report is made in "Journal of Applied Physics", Vol. 45, November No. 11, 1975, pp. 4899–4906, and the like, by way of example. U.S. Pat. No. 4,121,177 can be cited also as one of the prior art references. As to the buried-stripe double-heterostructure GaInAsP/InP diode laser, reference is to be had to "Applied Physics Letters", Vol. 30, No. 8, 15 Apr., 1977, pp. 429-431, "Lectures of No. 40th Japan Society of Applied Physics (1979)", pp. 186, 1p-N-11, entitled "The Characteristics of 1.3 μm InGaAsP/InP Buried-Heterostructure (BH) Laser", and so forth.

SUMMARY OF THE INVENTION

The present invention is directed to provide an improved BH laser structure which has an extremely small leakage current and hence, small variance of a current and which can be manufactured in an extremely high yield.

It is another object of the present invention to provide a method of manufacturing the semiconductor laser having the abovementioned characteristics while protecting a multi-layered semiconductor crystal surface to be formed on a semiconductor substrate.

The semiconductor laser device in accordance with the present invention has the following construction.

On a predetermined semiconductor substrate is disposed a mesa-shaped multi-layered semiconductor crystal having laminated thereon at least first, second and third semiconductor layers and a first surface protection layer for protecting the third semiconductor layer. Burying layers are disposed on both sides of the mesa-shaped multi-layered semiconductor crystal in order to bury the crystal and to prevent carriers from diffusing in the transverse direction.

The abovementioned second semiconductor layer is an active layer, which has a forbidden band gap smaller than those of the first and third semiconductor layers and a refractive index greater than those of the first and third semiconductor layers. The first and third semiconductor layers have conduction types that are opposite to each other.

The forbidden band gap of the burying layer at the portion at which the burying layer comes into contact with the second semiconductor layer is greater than at least that of the second semiconductor layer and has a smaller refractive index than that of the latter. At least one p-n junction is disposed inside this burying layer in parallel to the second semiconductor layer in such a fashion that this junction portion is placed under the reversely biased state at the time of the laser oscillation. As to the method of forming the p-n junction in parallel to the active layer, reference is to be had to Japanese Patent Laid-Open No. 13588/1976, for example. A patent application is also filed for a method of preventing the semiconductor laser breakdown using the p-n junction. The p-n junction is formed in substantially the same shape and size as the upper surface of the second semiconductor layer.

A second surface protection layer is formed on this burying layer for the surface protection.

In the BH laser having the abovementioned construction, it is one of the essential requirements in the present invention that the first surface protection layer does not come into direct contact with the second surface protection layer. According to this construction, a leakage current can be prevented sufficiently even when the forbidden band gaps of the surface protection layers are smaller than that of the semiconductor material forming the clad layer or the burying layer. In other words, the variance in the threshold currents can be minimized.

DESCRIPTION OF THE PREFERRED EMBODIMENTS

In the BH lasers, the leakage current increases depending upon the selection of the constituent materials of the lasers, the result being the disadvantage that the threshold current becomes high due to laser oscillation.

There exist two current paths in the BH laser, one being a current path for a current flowing from the electrode to the mesa-shaped multi-layered semiconductor crystal region including the active layer, and the other being a current path for a current flowing through the burying layer region. The current flowing through the latter current path is a leakage current. This problem becomes critical if the difference of voltage values of the currents starting to flow through both current paths, respectively, is small when an operating voltage is impressed. This problem becomes all the more critical when a semiconductor material having a relatively small forbidden band gap is employed.

A buried-heterostructure GaInAsP/InP semiconductor laser is its typical example.

Figure 1:
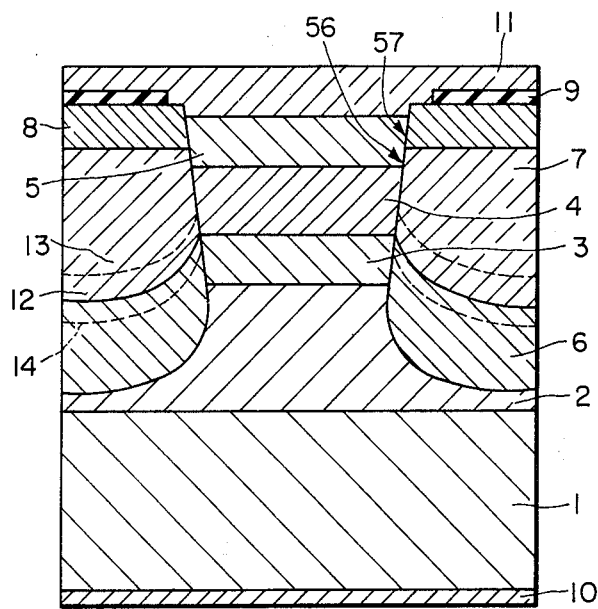
FIG. 1 is a sectional view showing the conventional buried heterostructure (BH) laser.

FIG. 1 is a sectional view of the buried-heterostructure GaInAsP/InP semiconductor laser. It is a sectional view as viewed from the plane perpendicular to the travelling direction of the laser light. In this embodiment a number of layers are laminated on an n-InP substrate 1. These layers include, in order, starting from the substrate: a first clad layer 2 of n-InP, an InGaAsP active layer 3, a second clad layer 4 of p-InP, and a p-InGaAsP cap layer 5.

This multi-layered assembly has a mesa-shape and its both sides are buried with burying layers. The burying layer consists of a laminate of a p-InP blocking layer 6, an n-InP layer 7 and an n-InGaAsP layer 8.

During the crystal growth, the abovementioned p-InGaAsP cap layer 5 and p-InGaAsP layer 8 serve to protect the semiconductor layers positioned below them, i.e. the p-InP clad layer 4 and the n-InP layer 7. If a semiconductor material containing phosphorous (P) is exposed on the grown crystal surface, P dissociates during the cooling step after the crystal growth so that it becomes difficult to keep the crystal surface under the satisfactorily flat condition. If the crystal surface is rough, high precision work becomes difficult to practise in the subsequent photolithographic step for forming an insulating layer 9 on these p-InP clad layer 4 and n-InP layer 7, by way of example. For the abovementioned reason, the InGaAsP layers 5 and 8 are indispensable layers in order to realize a semiconductor laser using a P-containing semiconductor material such as InP.

The surface protection layer for the surface protection may satisfy the following conditions:

(1) It is capable of assuming the lattic alignment with the lower crystal.
(2) Neither change in the composition nor surface roughing occurs during the crystal growth.

In view of these requirements, an In-Ga-As-P quaternary mixed crystal is selected for InP. InGaAsP having a forbidden band gap of 1.3 eV to 1.0 eV is suited as the surface protection layer.

The abovementioned buried-heterostructure GaInAsP/InP semiconductor laser is furnished with a P-InP blocking layer 6. This is intended to block the aforementioned leakage current flowing through the burying layer region.

In the example shown in FIG. 1, a p-n junction is formed at the position indicated by reference numeral 12. The p-n junction is brought under the reverse-biased state during the operation of the laser, and the leakage current is blocked. However, the thickness of the active layer is extremely thin, generally from 0.1 $\mu$m to 0.5 $\mu$m. It is therefore difficult practically to form the blocking layer at such an ideal position as shown in FIG. 1 and to form the p-n junction during the manufacture of the laser. It frequently happens, for example, that the p-n junction is formed at the position indicated by 13 or 14 in FIG. 1. Lattice defects such as a pit are also likely to occur in the blocking layer. If the effect of the blocking layer is not sufficient for these reasons or others, the leakage current would increase. Especially because the p-InGaAsP cap layer 5 and n-InGaAsP layer 8 are made of the materials having relatively small forbidden band gaps, this problem becomes especially critical. (Incidentally, whereas the forbidden band gap of InP is 1.35 eV, the forbidden band gap of In-GaAsP cap layer is mostly from about 1.3 eV to about 1.0 eV, though the value varies depending upon the composition.) This is the problem that lowers the production yield of the laser having the satisfactory characteristics during the mass production of the laser device.

The present invention contemplates to prevent the leakage current from flowing through both surface protection layers while allowing the surface protection layers to fully exhibit their surface protective functions. Accordingly, the leakage current can be sufficiently blocked even if the deviation of position of the blocking layer 6 or defects occur.

The gist of the present invention resides in the arangement in which the surface protection layers, each having a relatively small forbidden band gap, are formed at positions of different height from each other in order to prevent their direct contact.

Figure 2:
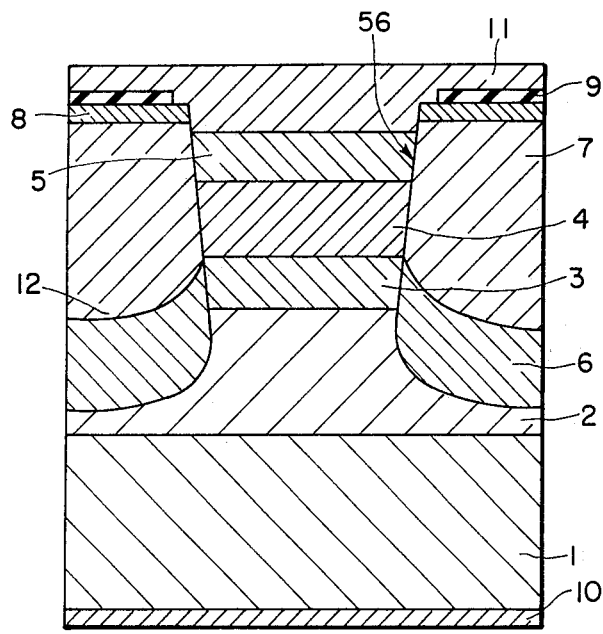
FIGS. 2, 7 and 8 are sectional views of the BH laser in accordance with the present invention.

FIG. 2 is a sectional view showing this construction. In this drawing, like reference numerals are employed to identify like constituents as in FIG. 1. Whereas a p-n junction 56 between p-InGaAsP and n-InP and a p-n junction 57 between p-InGaAsP and n-InGaAsP exist in the example shown in FIG. 1, only one p-n junction 56 exists between p-InGaAsP and n-InP in FIG. 2.

It is also possible to employ a manufacturing method which first forms the burying layer-InP layer by use of the surface protection layer 8 and then removes the surface protection layer.

FIGS. 3a through 3k are sectional views showing the manufacturing steps of the semiconductor laser device in accordance with the present invention.

An n-InP layer 2 (Te dope: $2 \times 10^{18}$ cm$^{-3}$, thickness: 1 $\mu$m), an InGaAsP active layer 3 (undoped, thickness: 0.2 $\mu$m), a p-InP layer 4 (Zn dope: $1 \times 10^{18}$ cm$^{-3}$, thickness: 4 $\mu$m) and a p-InGaAsP cap layer 5 (composition: In$_{0.84}$Ga$_{0.16}$As$_{0.36}$P$_{0.64}$, thickness: 1 $\mu$) are allowed to sequentially grow on an n-type InP substrate 1 (Sn dope: $1 \times 10^{18}$ cm$^{-3}$) having a (100) plane on its main plane in accordance with the known liquid growth method. It is of importance that this p-InGaAsP cap layer 5 be so allowed as to grow in succession to the growth of the p-InP layer 4. This prevents the dissociation of P of the InP layer.

Figure 3A:
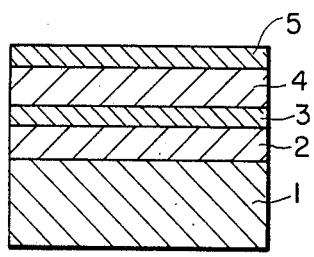
FIGS. 3a through 3f and FIGS. 6a and 6b are sectional views, each showing the manufacturing steps of the BH laser.
Figure 3B:
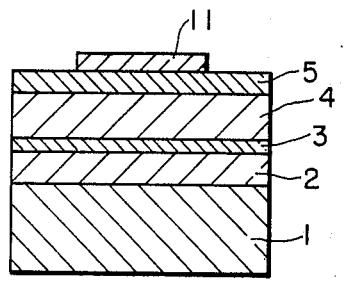

Next, as depicted in FIG. 3b, an oxide film is deposited in a thickness of 0.3 $\mu$m on the abovementioned cap layer 5 by the CVD process (Chemical Vapor Deposition process) to form a stripe-shaped pattern 11 (hereinafter called a "stripe layer" 11) having a width of about 7 $\mu$m. The stripe layer is selected in such a direction that its longitudinal direction is perpendicular to the cleavage plane (001) of the abovementioned crystal substrate 11, that is to say, in the <001> direction.

Figure 3C:
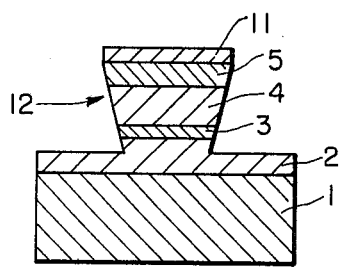

As shown in FIG. 3c, etching is then effected using the stripe layer 11 as the mask and a Br-methanol mixed solution (containing 1% by volume of Br) as the etching solution till it reaches the clad layer 2, thereby forming the mesa portion 12. Due to the direction of the stripe and to the peculiar chemical action of the etching solution, the abovementioned mesa portion is formed in an inverted trapezoidal shape, or a so-called "inverted mesa structure".

The active layer 3 has a width of 1.0 to 1.5 $\mu$m and forms an active region of an extremely narrow width. In other words, it can be formed in a width which is from ¼ to 1/6 of the width of the stripe layer 11. Though the width of the active region is extremely narrow, a stripe having a relatively large width, i.e., 6 $\mu$m, is formed on the crystal surface of the surface layer 5 and is extremely advantageous for the formation of electrodes.

Figure 3D:
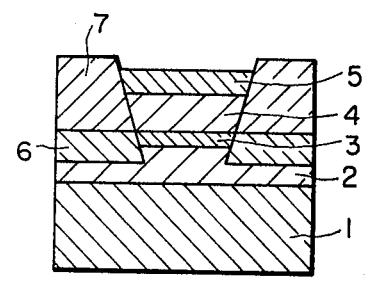
Figure 3E:
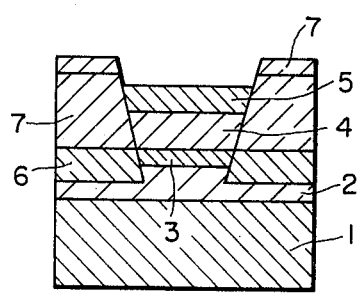
Figure 3F:
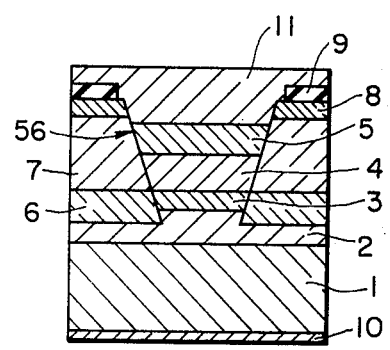

Next, as shown in FIG. 3d, a p-InP layer and an n-InP layer as the burying layers 6, 7 and an n-InGaAsP layer 8 (composition: In$_{0.84}$Ga$_{0.16}$As$_{0.36}$P$_{0.64}$) as the surface protection layer 8 are allowed to grow on the n-InP layer 2 exposed by etching. The solutions used for the growth of the semiconductor layers are illustrated in Table 1 below.

TABLE 1

| Growth layer (reference numeral in the drawing) | | In (g) | GaAs (mg) | InAs (mg) | InP (mg) | Zn (mg) | Te (mg) | Growing temperature (°C.) |
| --- | --- | --- | --- | --- | --- | --- | --- | --- |
| multi-layer assembly | n-InP (2) | 5 | — | — | 36 | — | 2 | 560 |
| | InGaAsP (3) | 5 | 50 | 331 | 25 | — | — | 560 |
| | p-InP (4) | 5 | — | — | 36 | 0.32 | — | 560 |
| | p-InGaAsP (5) | 5 | 25 | 222 | 22 | 0.32 | — | 617 |
| burying layers | p-InP (6) | 5 | — | — | 36 | 0.03 | — | 560 |
| | n-InP (7) | 5 | — | — | 36 | — | — | 560 |
| | n-InGaAsP (8) | 5 | 25 | 222 | 22 | — | — | 617 |

The upper surface of the p-InP layer 6 is placed at the same height as that of the InGaAsP active layer 3, but the upper surface of the n-InP layer 7 is placed at a position higher than the surface protection layer 5. A step of at least about 0.05 μm must be formed in this instance.

It is essential that the surface protection layer 8 be allowed to grow in succession to the growth of the n-InP layer 7. This prevents dissociation of phosphorous of the InP layer.

An SnO₂ film is formed by the CVD process on the semi-conductor substrate thus prepared.

Diffusion windows are formed on the oxide film in substantial alignment with the pattern of the stripe 11. Zn is then diffused using ZnP₂ as the source through the windows. The diffusion temperature in this case is 550° C. and the diffusion time, 5 minutes. The depth of the diffusion layer is about 1 to about 1.5 μm. Since this diffusion layer has a high impurity concentration, its ohmic contact with the electrode, which will be described elsewhere, becomes good.

The back of the crystal substrate 1 is polished and etched in a reduced thickness of about 100 μm, and a Cr/Au conductor film 11 is vacuum-deposited on the diffusion layer on the p-conduction front side and on the oxide film 9 at room temperature with an Au Sn (10%) conductor film 10 on the n-conduction back side at 330° C., thereby forming the ohmic electrode.

Finally, the substrate is divided into chips of a cavity length of 300 μm by cleaving. The semiconductor laser device is thus perfected.

Figure 4:
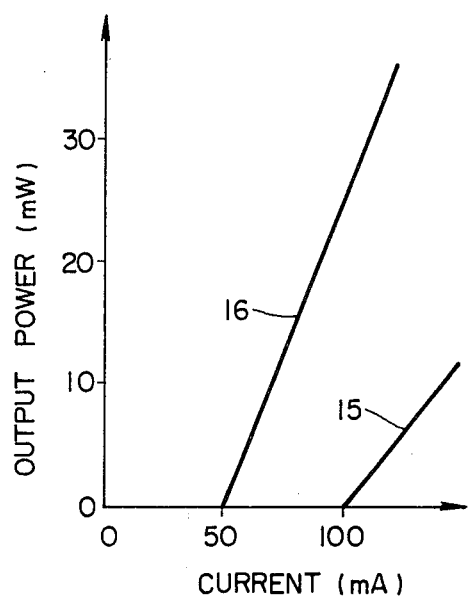
FIG. 4 is a light-output-v.-current characteristics diagram.

FIG. 4 is a diagram showing the light-output-v.-current characteristics. Output power is from one facet. The characteristic 15 represents a sample having a large leakage current while the characteristic 16 represents a sample that does not have substantially any leakage current as in the embodiment of the present invention. In the embodiment devoid of the leakage current, the threshold current is as low as 50 mA and differential quantum efficiency per facet is 16%, whereas it is 80% in the sample 15 having a large leakage current.

Figure 5:
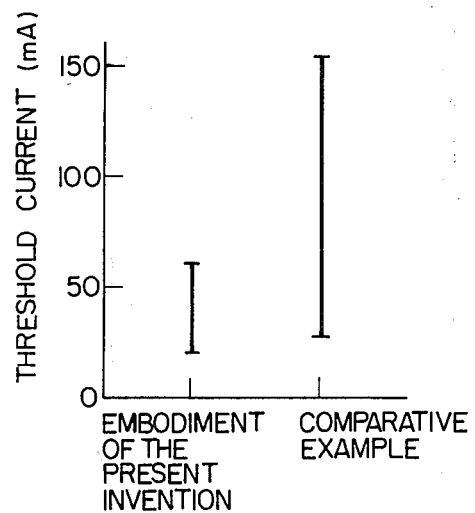
FIG. 5 is a diagram showing the variance of the threshold currents.

FIG. 5 is a diagram showing the distribution of the threshold current values of the laser having the construction of FIG. 1 and the laser (of the embodiment of the present invention) shown in FIG. 2. It can be understood that in accordance with the present invention, a semiconductor laser having extremely small variance of the threshold currents can be materialized.

The thickness of the n-InGaAsP layer 8 on the burying layer may be suitably reduced by etching after the formation of the burying layer or it may be perfectly removed. This makes it possible to reduce the step on the grown crystal surface.

Figure 6A:
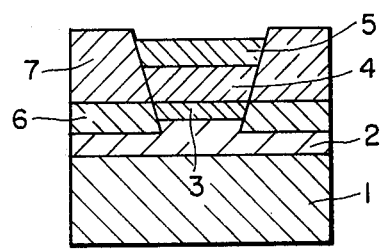
Figure 6B:
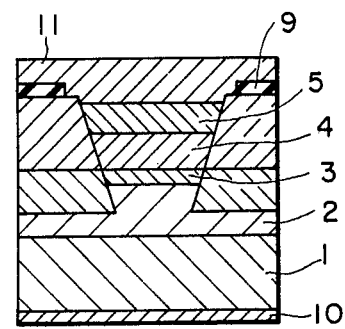

FIGS. 6a and 6b show an embodiment in which the surface protection layer 7 on the burying layers is removed therefrom. Under the state shown in FIG. 3c, the surface protection layer 7 is removed by etching from the semiconductor body having laminated thereon the semiconductor layers (see FIG. 6a). The etching solution may be a mixed solution of $H_2SO_4:H_2O_2:H_2O = 5:1:1$. Next, in the same way as in the abovementioned embodiment, the oxide layer 9 is formed, followed by the formation of the electrodes 10 and 11 (see FIG. 6b).

Figure 7:
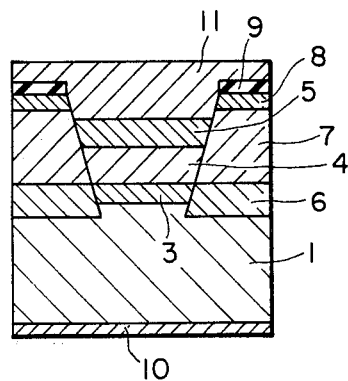
Figure 8:
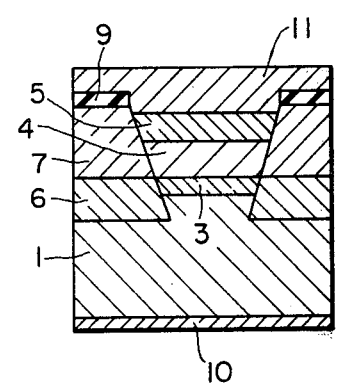

If a material capable of serving as the clad layer for the InGaAsP active layer, such as the InP substrate, is employed, the InGaAsP active layer and the like may be formed directly on the InP substrate without forming the first clad layer 2. FIGS. 7 and 8 show such embodiments. Since like reference numerals are employed in these drawings to identify like constituents as in the foregoing drawings, detailed explanation is not given. FIG. 7 shows an embodiment in which the surface protection layer 8 is left and FIG. 8 shows an embodiment in which the surface protection layer is removed. The manufacturing method is exactly the same as employed in the foregoing embodiments except that the formation of the first clad layer 2 is deleted.

Although the foregoing embodiments deal with the inverted mesa-type BH laser, the present invention can naturally be adapted to the ordinary BH lasers. The present invention can also be applied to the semiconductors of compounds of the Group IV-V of the periodic table other than the abovementioned Inp/InGaAsP type.

What is claimed is:
1. In a semiconductor laser device including:
  a mesa-shaped optical confinement region providing an optical cavity for laser light disposed on a predetermined semiconductor substrate and having an active layer and a clad layer and a crystal surface;
  a burying layer having a crystal surface burying both sides, in the direction crossing the travelling direction of the laser light, of said mesa-shaped optical confinement region;
  first and second semiconductor layers for protecting said crystal surfaces, disposed on said mesa-shaped optical confinement region and on said burying layer, respectively;
  said first and second semiconductor layers made of a material having a forbidden band gap smaller than those of semiconductor layers to be disposed therebelow;

a first electrode disposed on the upper part of said mesa-shaped optical confinement region contacting at least said first semiconductor layer; and a second electrode disposed on the lower side of said semiconductor substrate, the improvement comprising said first and second semiconductor layers located at different levels so that the upper surface of one of said semiconductor layers is below the lower surface of the other semiconductor layer whereby said first and second semiconductor layers will therefore not come into contact with each other.

2. The semiconductor laser device as defined in claim 1 wherein said semiconductor substrate, said active layer, said clad layer, said burying layer and said first and second semiconductor layers for protecting the crystal surface are made of an InP crystal, an InGaAsP crystal, an InP crystal, an InP crystal and an InGaAsP crystal, respectively.

3. The semiconductor laser device as defined in claim 1, wherein at least one p-n junction is formed inside said burying layer in parallel to said active layer such as to be brought under a reversely biased state during operation of said laser device.

4. A semiconductor laser device according to claim 1 or 3 and further including a further clad layer disposed between said substrate and said active layer.

5. A semiconductor laser device according to claim 4, wherein said further clad layer is made of an InP crystal.

6. The semiconductor laser device as defined in claim 1 wherein said semiconductor substrate, said active layer, said clad layer, said burying layer and said first and second semiconductor layers for protecting the crystal surface are made of an InP crystal, an InGaAsP crystal, an InP crystal, an InP crystal and an InGaAsP crystal, respectively, and wherein at least one p-n junction is formed inside said burying layer in parallel to said active layer such as to be brought under a reversely biased state during operation of said laser device.

* * * * *

UNITED STATES PATENT AND TRADEMARK OFFICE
CERTIFICATE OF CORRECTION

PATENT NO. : 4,426,700

DATED : January 17, 1984

INVENTOR(S) : Motohisa Hirao, et al.

It is certified that error appears in the above-identified patent and that said Letters Patent is hereby corrected as shown below:

Col. 5, line 57, change "80%" to --8%--.

Signed and Sealed this

Fifteenth Day of May 1984

[SEAL]

Attest:

GERALD J. MOSSINGHOFF

Attesting Officer

Commissioner of Patents and Trademarks